(12) United States Patent
Sethumadhavan et al.

(10) Patent No.: US 7,572,515 B2
(45) Date of Patent: Aug. 11, 2009

(54) CIRCUIT MATERIALS, CIRCUITS, MULTI-LAYER CIRCUITS, AND METHODS OF MANUFACTURE THEREOF

(75) Inventors: Murali Sethumadhavan, Shrewsbury, MA (US); Vincent R. Landi, Phoenix, AZ (US); Luis D. Borges, Pomfret Center, CT (US)

(73) Assignee: World Properties, Inc., Lincolnwood, IL (US)

( * ) Notice: Subject to any disclaimer, the term of this patent is extended or adjusted under 35 U.S.C. 154(b) by 356 days.

(21) Appl. No.: 11/039,378

(22) Filed: Jan. 19, 2005

(65) Prior Publication Data

US 2005/0173780 A1   Aug. 11, 2005

Related U.S. Application Data

(60) Provisional application No. 60/537,944, filed on Jan. 20, 2004.

(51) Int. Cl.
    *B32B 25/20* (2006.01)
(52) U.S. Cl. .................. 428/447; 428/450; 525/474; 525/477; 525/476; 525/479
(58) Field of Classification Search .......... 525/474, 525/477, 476, 479; 428/447, 450
See application file for complete search history.

(56) References Cited

U.S. PATENT DOCUMENTS

| | | | |
|---|---|---|---|
| 4,737,398 A | 4/1988 | Ikenaga et al. | 428/216 |
| 4,802,061 A | 1/1989 | Portugall et al. | 361/400 |
| 4,871,595 A | 10/1989 | Lusignea et al. | 428/1 |
| 4,876,120 A | 10/1989 | Belke et al. | 428/1 |
| 4,904,752 A | 2/1990 | Kanoe et al. | 528/97 |
| 4,910,077 A | 3/1990 | Benedikt | 428/251 |
| 4,963,428 A | 10/1990 | Harvey et al. | 428/220 |
| 4,966,806 A | 10/1990 | Lusignea et al. | 428/220 |
| 4,966,807 A | 10/1990 | Harvey et al. | 428/220 |
| 4,975,312 A | 12/1990 | Lusignea et al. | 428/209 |
| 5,079,289 A | 1/1992 | Layton et al. | 524/600 |
| 5,147,967 A | 9/1992 | Stern et al. | 528/193 |
| 5,164,458 A | 11/1992 | Jennings et al. | 525/389 |
| 5,216,092 A | 6/1993 | Huspeni et al. | 525/444 |
| 5,288,529 A | 2/1994 | Harvey et al. | 428/1 |
| 5,360,647 A | 11/1994 | Sumida | 428/1 |
| 5,484,867 A | 1/1996 | Lichtenhan et al. | 528/9 |
| 5,516,983 A | 5/1996 | Kishimoto et al. | |
| 5,529,740 A | 6/1996 | Jester et al. | 264/317 |
| 5,703,202 A | 12/1997 | Jester et al. | 528/481 |
| 5,719,354 A | 2/1998 | Jester et al. | 174/255 |
| 5,847,039 A | 12/1998 | Nagashima et al. | 524/432 |
| 5,900,292 A | 5/1999 | Moriya | 428/1 |
| 6,027,771 A | 2/2000 | Moriya | 428/1 |
| 6,124,004 A | 9/2000 | Furuta et al. | 428/1.1 |
| 6,284,385 B1 * | 9/2001 | Guillaumon et al. | 428/450 |
| 6,425,936 B1 * | 7/2002 | Sammons et al. | 95/45 |
| 6,472,076 B1 | 10/2002 | Hacker | |
| 6,538,211 B2 | 3/2003 | St. Lawrence et al. | 174/258 |
| 6,623,711 B2 | 9/2003 | Lyu et al. | |
| 6,716,919 B2 | 4/2004 | Lichtenhan et al. | |
| 7,180,172 B2 * | 2/2007 | Sethumadhavan et al. | 257/702 |
| 2002/0074158 A1 | 6/2002 | St. Lawrence et al. | 174/258 |
| 2002/0076538 A1 | 6/2002 | St. Lawrence et al. | 428/209 |
| 2002/0081443 A1 | 6/2002 | Connelly et al. | 428/458 |
| 2002/0192980 A1 | 12/2002 | Hogle et al. | 438/778 |
| 2002/0193533 A1 | 12/2002 | Kamo et al. | 525/397 |
| 2004/0262739 A1 | 12/2004 | Sethumadhavan et al. | |

FOREIGN PATENT DOCUMENTS

| | | |
|---|---|---|
| CA | 2273542 | 6/1998 |
| EP | 0697278 | 8/1995 |
| WO | WO 01/72885 A1 | 10/2001 |
| WO | WO 2005/004220 A1 | 1/2005 |

OTHER PUBLICATIONS

International Application No. PCT/US2005/003118; International Search Report dated Sep. 29, 2005.
International Application No. PCT/US2005/003118; Written Opinion dated Sep. 29, 2005.
JP2000070630. Publication Date: Mar. 7, 2000. "Heat Resistant Filter Element". (Abstract Only).
JP2002317112. Publication Date: Oct. 31, 2002. "Polyphenylene Ether Resin Composition" (Abstract Only).
Electronic Surface Mounting Technology, vol. 7. No. 6. pp. 54-55 (Jun. 1, 1997).
Vectra Liquid Crystal Polymer (LCP). Ticona Product Brochure, www.ticona.com, pp. 1-76, (Sep. 2001).
Yoshikawa, "Liquid Crystal Polymer (LCP) Film "Vecstar"". Electronic Parts and Materials. Published Oct. 1, 2000. vol. 39, No. 10, pp. 42-46.
Yoshikawa, et al. "Liquid Crystal Polymer Substrate for Multilayer PWB" Translation Proc. 13th JIEP Annual Meeting. Mar. 3, 1999. pp. 95-96.
Haddad, et al. "Hybrid Organic-Inorganic Thermoplastics: Styryl-Based Polyhedral Oligomeric Silsesquioxane Polymers" Macromolecules 1996, 29, 7302-7304.
Lichtenhan, et al. "Silsesquioxane-Siloxane Copolymers from Polyhedral Silsesquioxanes" Macromolecules 1993, 26, 2141-2142.
Lichtenhan, et al. "Linear Hybrid Polymer Building Blocks: Methacrylate-Functionalized Polyhedral Oligomeric Silsesquioxane Monomers and Polymers" Macromolecules 1995, 28, 8435-8437.
Tsuchida, et al. "Ethene and Propene Copolymers Containing Silsesquioxane Side Groups". Macromolecules 1997, 30, 2818-2824.

* cited by examiner

*Primary Examiner*—Kuo-Liang Peng
(74) *Attorney, Agent, or Firm*—Cantor Colburn LLP

(57) ABSTRACT

An electrical circuit material having a conductive layer disposed a substrate, wherein the substrate comprises an organic or inorganic polymer comprising a covalently bound polyhedral silsesquioxane (POSS). The substrate may further comprise an additional dispersed POSS, any other fillers including fibrous webs. Use of covalently bound POSS allows for flame retardancy in compositions having acceptable dielectric constants and dissipation factors.

26 Claims, 2 Drawing Sheets

CIRCUIT MATERIALS, CIRCUITS, MULTI-LAYER CIRCUITS, AND METHODS OF MANUFACTURE THEREOF

CROSS REFERENCE TO RELATED APPLICATION

This application claims the benefit of U.S. Provisional Application No. 60/537,944, filed Jan. 20, 2004, which is incorporated herein by reference in its entirety.

BACKGROUND

This invention relates to dielectric materials useful in the formation of circuit materials, circuits, and multi-layer circuits.

As used herein, a circuit material is an article used in the manufacture of circuits and multi-layer circuits, and includes circuit laminates, bond plies, resin coated conductive layers, and cover films. Circuit materials are formed from a dielectric material that can be a thermosetting or thermoplastic polymer. The polymers are often combined with fillers such as silica to adjust the dielectric or other properties of the polymer. The dielectric material in a bond ply, resin covered conductive layer, or cover film may be substantially non-flowable, i.e., it softens or flows during manufacture but not use of the circuit, whereas the dielectric material in a circuit laminate (i.e., a dielectric substrate) is designed to not soften or flow during manufacture or use of the circuit or multi-layer circuit. Dielectric substrate materials can be rigid dielectric materials, which may comprise a fibrous web and/or other forms of reinforcement, such as short or long fibers or fillers.

A circuit laminate is a type of circuit material that has a conductive layer fixedly bound to a dielectric substrate layer. Double clad laminates have two conductive layers, one on each side of the dielectric substrate. Patterning a conductive layer of a laminate, for example by etching, provides a circuit layer, and thus a circuit. Multi-layer circuits comprise a plurality of conductive layers, at least one of which contains a conductive wiring pattern. Typically, multi-layer circuits are formed by laminating one or more circuits together using bond plies, and, in some cases, resin coated conductive layers, in proper alignment using heat and/or pressure. The bond plies are used to provide adhesion between circuits and/or between a circuit and a conductive layer, or between two conductive layers. In place of a conductive layer bonded to a circuit with a bond ply, the multi-layer circuit may include a resin coated conductive layer bonded directly to the outer layer of a circuit. In such multi-layer structures, after lamination, known hole forming and plating technologies may be used to produce useful electrical pathways between conductive layers.

A variety of polymeric dielectric materials are presently used to form in circuit materials, including phenol-formaldehyde resins, epoxy resins and, and isoprene and butadiene-based resins. Current polymeric dielectric materials often themselves are not flame retardant, and may thus contain bromine-containing additives to achieve a UL 94 rating of V-0. Due to new legislation in, for example, Europe and Japan, there is a great interest in removing bromine-containing compounds from circuit materials. Unfortunately, substitution of the bromine-containing compounds with other flame retardance additives often requires the addition of large amounts of additive, which can be detrimental to the electrical properties of laminates made with the polymeric materials. There thus remains a need for flame retardant polymeric materials for use in circuit materials, circuits, and multi-layer circuits that have suitable electrical and thermal properties.

BRIEF SUMMARY

The above-described drawbacks and disadvantages are alleviated by a circuit material comprising a polymer comprising a covalently bound polyhedral silsesquioxane.

In another embodiment, a circuit material comprises a conductive layer disposed on a dielectric layer, wherein the dielectric layer comprises a polymer comprising a covalently bound polyhedral silsesquioxane. An additional conductive layer may be disposed on the opposite side of the dielectric layer to form a double-clad circuit material. Additional circuit layers may be added to make a multi-layer circuit. In another embodiment, the dielectric layer further comprises a fibrous mat.

The polymer comprising a covalently bound polyhedral silsesquioxane is inherently flame retardant and can be used to form flame retardant circuit materials having excellent electrical and physical properties. The above discussed and other features and advantages of the present invention will be appreciated and understood by those skilled in the art from the following detailed description and drawings.

BRIEF DESCRIPTION OF DRAWINGS

Referring now to the exemplary drawings wherein like elements are numbered alike in the several FIGURES.

DETAILED DESCRIPTION

Figure 1:
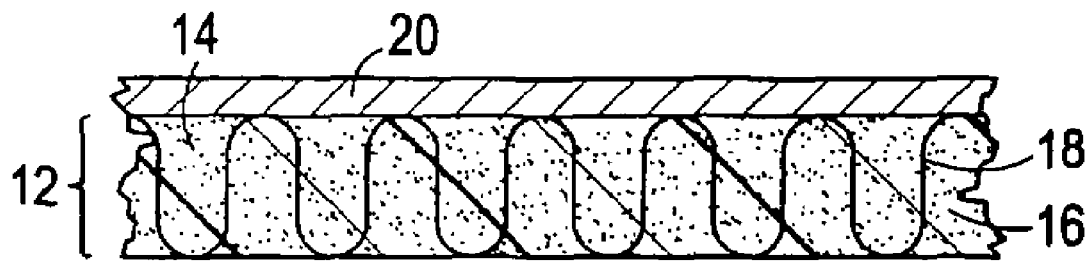
FIG. 1 is a schematic representation of an exemplary circuit material comprising a covalently bound polyhedral silsesquioxane polymer material, a woven web, and a conductive layer.

Circuit materials are described herein, formed from dielectric materials comprising a polymer comprising a covalently bound polyhedral silsesquioxane (POSS). Such polymers enable the production of flame retardant circuit materials having good electrical and thermal properties. By "covalently bound POSS," it is meant that the POSS is covalently bonded to the polymer as a pendant group or as a repeat unit within the polymer. The composition may further comprise a dispersed POSS, wherein the dispersed POSS is the same or different than the covalently bound POSS. In combination with silica and/or glass cloth, rigid circuit materials having suitable electrical properties and a UL-94 rating of V-0 can be made without the addition of halogenated flame retardants.

Because POSS resins are thermoset in nature and cure at low temperatures, the polymer comprising covalently bound POSS groups may also be used as a bond-ply layer for other laminates, for example those based on liquid crystalline polymers.

Suitable polymers for covalent attachment of POSS groups include, for example, silicone resins, 1,2-polybutadienes, polyisoprenes, polyesters, acrylate esters, polybutadiene-polyisoprene copolymers, allylated polyphenylene ethers, and thermoplastic resins such as polyphenylene ethers (PPE), bismaleimide triazines (BT), epoxys, cyanate esters, dialkylsiloxane polymers such as dimethylsiloxane polymers, and combinations comprising at least one of the foregoing resins. Mixtures of thermosetting resins and thermoplastics may also be used, non-limiting examples including epoxy-impregnated polytetrafluoroethylene (PTFE), epoxy-coated PTFE, epoxy-polyphenylene ether, epoxy-polyetherimide (PEI), cyanate ester-PPE, and 1,2-polybutadiene-polyethylene. Compositions containing polybutadiene, polyisoprene, and/or polybutadiene and polyisoprene copolymers are especially useful. Other useful polymers include diorganosiloxane polymers containing monovalent hydrocarbons having up to 16 carbon atoms, specifically alkyl, alkenyl, or aryl groups having up to 8 carbon atoms, more specifically phenyl or lower alkyl or alkenyl having up to 6 carbon atoms, most specifically a methyl or phenyl, for example polydimethylsiloxanes, polydivinylsiloxanes, and polydiphenylsiloxanes.

Polyhedral silsesquioxanes have the generic formula $(RSiO_{1.5})_n$, wherein R is an organic moiety and n is 6, 8, 10, 12, or higher. These molecules have rigid, thermally stable silicon-oxygen frameworks with an oxygen to silicon ratio of 1.5, and covalently-bound organic groups that provide an organic outer layer comprising, for example, hydrocarbons (e.g., vinyl, phenyl, isooctyl, cyclohexyl, cyclopentyl, isobutyl, or other hydrocarbons), as well as functional groups such as ester, epoxy, acrylate, or other functional groups. A specific POSS is a vinyl POSS. POSS may have surface areas greater than 400 square meters per gram ($m^2$/gm). An $Si_8$ POSS structure is illustrated below.

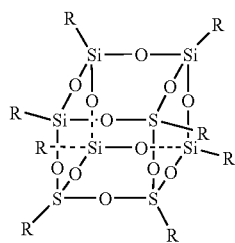

Copolymerization or attachment as a pendant group can be by use of functionalized POSS (also known as "POSS monomers"), wherein one, two, or more of the covalently bound organic groups are reactive with at least one monomer or oligomer used to form the polymer, or with at least one group in the polymer. In some cases, it is possible to have all of the covalently bound organic groups be reactive groups.

Functionalized POSS may be prepared, for example, by corner-capping an incompletely condensed POSS containing trisilanol groups with a substituted trichlorosilane. For example, the trisilanol functionality of $R_7T_4D_3(OH)_3$ (wherein R is a hydrocarbon group) can be reacted with $Cl_3Si$—Y to produce the fully condensed POSS monomer $R_7T_8Y$. In the following structure, T is $SiO_{1.5}$, and Y is an organic group comprising a functional group.

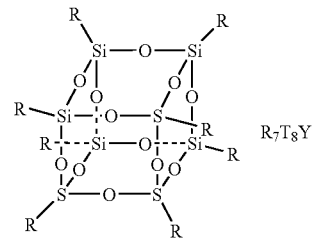

Through variation of the Y group on the silane, a variety of functional groups can be placed off the corner of the POSS framework, including but not limited to halide, alcohol, amine, hydride, isocyanate, acid, acid chloride, silanols, silane, acrylate, methacrylate, olefin, and epoxide.

Further examples of suitable POSS monomers include those of the general formula $R_{n-m}T_nY_m$ wherein R is a hydrocarbon; n is 6, 8, 10, 12 or higher; m is 1 to n; T is $SiO_{1.5}$, and Y is an organic group comprising a functional group, wherein the functional group includes, for example, halide, alcohol, amine, isocyanate, acid, acid chloride, silanols, silane, acrylate, methacrylate, olefin, and epoxide. A suitable POSS monomer has, for example, an n of 8; m of 1, 2, 3, 4, 5, 6, 7, or 8; R of $C_1$-$C_{24}$ straight, branched, or cyclic alkyl, $C_1$-$C_{24}$ aromatic, alkylaryl, or arylakyl, wherein the alkyl, or aromatic is optionally substituted with $C_1$-$C_6$ alkyl, halo, $C_1$-$C_6$ alkoxy, $C_1$-$C_6$ perhaloalkyl, and the like.

Another suitable POSS monomer includes those of the general formula $R_7T_4D_3(OY)_3$

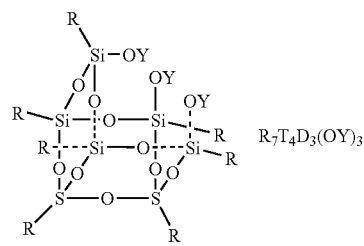

wherein R and Y are as defined previously for the $R_7T_8Y$ POSS monomer.

Suitable functional groups are epoxies, esters and acrylate (—X—OC(O)CH=$CH_2$) and methacrylate (—X—OC(O)CH($CH_3$)=$CH_2$) groups, wherein X is a divalent linking group having 1 to about 36 carbons, such as methylene, ethylene, propylene, isopropylene, butylene, isobutylene, phenylene, and the like. X may also be substituted with functional groups such as ether (e.g., —$CH_2CH_2OCH_2CH_2$—), as long as such functional groups do not interfere with formation or use of the POSS. X may be propylene, isobutylene, or —$OSi(CH_3)_2CH_2CH_2CH_2$—. One, all, or an intermediate number of the covalently bound groups may be acrylate or methacrylate groups (hereinafter (meth)acrylate). Such functionalized POSS are available from Gelest, Inc. (Tullytown, Pa.) and Hybrid Plastics Corp. A methacryloxypropyl-substituted $T_8$ POSS (wherein all positions of the polyhedron are methacryloxypropyl-substituted) is available under the trade designation MA0735 from Hybrid Plastics Corp. Another methacryloxypropyl-substituted $T_8$ POSS (wherein one position is methacryloxypropyl-substituted and the remaining positions are isobutyl-substituted) is available under the trade designation MA0702 from Hybrid Plastics Corp (Fountain Valley, Calif.).

The linking groups X are suitable for use with other functional groups. Other POSS structures include, for example $T_6$, $T_8$, $T_{10}$, or $T_{12}$ structures functionalized with alkoxysilanes such as diethoxymethylsilylethyl, diethoxymethylsilylpropyl, ethoxydimethylsilylethyl, ethoxydimethylsilylpropyl, triethoxysilylethyl, and the like; with styrene, such as styrenyl ($C_6H_5CH=CH—$), styryl (—$C_6H_4CH=CH_2$) and the like; with olefins such as allyl, —$OSi(CH_3)_2CH_2CH=CH_2$, cyclohexenylethyl, —$OSi(CH_3)_2CH=CH_2$ and the like; with epoxies, such as 4-propyl-1,2-epoxycyclohexyl, 3-propoxy, glycidyl (—$CH_2CH_2CH_2OCH_2CH(O)CH_2$), and the like; with chlorosilanes such as chlorosilylethyl, dichlorosilylethyl, trichlorosilylethyl, and the like; with amines such as aminopropyl, aminoethylaminopropyl, and the like; with alcohols and phenols such as —$OSi(CH_3)_2CH_2CH_2CH_2OC(CH_2CH_3)_2(CH_2CH_2OH)$, 4-propylene-trans-1,2-cyclohexanediol, —$CH_2CH_2CH_2OCH_2C(CH_2OH)(OH)$, and the like; with phosphines such as diphenylphosphinoethyl, diphenylphosphinopropyl, and the like; with norbornenyls such as norbornenylethyl; with nitriles such as cyanoethyl, cyanopropyl, —$OSi(CH_3)_2CH_2CH_2CH_2CN$, and the like; with isocyanates such as isocyanatopropyl, —$OSi(CH_3)_2CH_2CH_2CH_2NCO$, and the like, with halides such as 3-chloropropyl, chlorobenzyl (—$C_6H_4CH_2Cl$), chlorobenzylethyl, 4-chlorophenyl, trifluoropropyl (including a $T_8$ cube with eight trifluoropropyl substitutions) and the like; and with esters, such as ethyl undecanoat-1-yl and methyl propionat-1-yl, and the like. Certain polymers such as poly(dimethyl-comethylhydrido-co-methylpropyl polymers, poly(dimethyl-comethylvinyl-co-methylethylsiloxy, poly(ethylnorbonenyl-co-norbonene) and poly(ethylsilsesquioxan) may also be used to functionalize POSS. Many of these substitutions are commercially available on $T_8$ POSS from Hybrid Plastics Corp. and Gelest.

The POSS monomers can be polymerized using standard techniques to yield inorganic-organic hybrid copolymers such as, for example, radical polymerization methods. The copolymers can contain randomly distributed POSS, or blocks of POSS monomers. For example, a block silsesquioxane polymer may be produced by homopolymer chain growth to a desired length followed by the addition of a second monomer feed and subsequent polymerization until the desired segment length is reached. This process can be followed by subsequent re-additions and polymerizations. A variation of this procedure can be carried out by the addition of two or more silsesquioxane oligomers to a solution followed by polymerization to form a polymer containing silsesquioxane units in a random or ordered fashion.

Alternatively, or in addition to copolymerization, polyhedral oligomeric silsesquioxane may be covalently bound to a preformed polymer backbone or chain. Grafting reactions may be used where the POSS contains one functional point of attachment, such as when the reactive group Y is a hydride, chloride, or alcohol. For example, a grafting reaction of a polyhedral oligomeric silsesquioxane to a polymer with terminal vinyl groups may proceed in THF solution over the course of several hours in the presence of a hydrosilylation catalyst such as a Karsted catalyst or a Speir catalyst such as hexachloroplatinic acid. Synthesis of silsesquioxane polymers from this reaction results from addition of the reactive silicon-hydrogen bond across the vinylic bond of the parent polymer.

The amount of covalently bound POSS in the polymer can be about 20 weight percent (wt %) to about 80 wt %, based on the total weight of the polymer comprising covalently bound POSS. Specific amounts are about 30 to about 70 wt %, and even more specifically about 40 to about 60 wt %, based on the total weight of the polymer comprising covalently bound POSS.

The dielectric material may further optionally comprise a dispersed POSS which is the same or different than the covalently bound POSS. A suitable dispersed POSS is, for example, a vinyl POSS. When present, the dispersed POSS can comprise about 20 wt % to about 80 wt % of the total weight of the dielectric material. Specific amounts are about 30 to about 70 wt %, and even more specifically about 40 to about 60 wt %, based on the total weight of the dielectric material.

In addition to the polymer comprising covalently bound POSS, the dielectric material may comprise other additives, for example, polymers, crosslinking agents, cure agents, and the like. For example, the dielectric material may comprise other polymers that are known for use in circuit board materials, such as polybutadiene, polyisoprene, and the like. Thus, the dielectric materials may comprise about 5 wt % to about 70 wt %, based on the total weight of the dielectric material, of a second polymer that is chemically distinct from the polymer comprising covalently bound POSS. A specific amount of the second polymer is about 10 to about 60 wt %, and even more specifically about 15 to about 50 wt %, based on the total weight of the dielectric material.

In one embodiment, the second polymer may be a low molecular weight polymer having a molecular weight of less than about 10,000, and that contains reactive groups that enable covalent binding with POSS. Such polymers may be useful as compatibilizing and/or crosslinking agents. Suitable reactive groups include epoxy, maleate, hydroxy, carboxyl, methacrylate, and alkenyl groups, more specifically vinyl groups. Suitable second polymers include, for example, low molecular weight polybutadiene, alkenyl-terminated polyphenylene oxides, (meth)acrylate polymers, and the like. Low molecular weight thermosetting polybutadiene- or polyisoprene-based resins include but are not limited to epoxy, maleate, hydroxy, carboxyl and methacrylate-functionalized resins. Possible functionalized liquid polybutadiene resins are available from Nippon Soda Co., Ltd., and include those under the trade names Nisso G-1000, G-2000, G-3000; Nisso C-1000; Nisso BN-1010, BN-2010, BN-3010, CN-1010; Nisso TE-2000; and Nisso BF-1000. Another suitable functionalized polymer is commercially available from Colorado Chemical Specialties, Inc. under the trade name Ricon 131/MA.

Polydiorganosiloxanes having on average two silicon-bonded alkenyl groups per molecule, for example one linked to each of the terminal silicon atoms of the molecule, are also suitable second polymers. The organic groups of the polydiorganosiloxane may each independently be a monovalent hydrocarbon having up to 16 carbon atoms, specifically an alkyl or aryl group having up to 8 carbon atoms, more specifically a lower alkyl having up to 6 carbon atoms, most specifically a methyl. The alkenyl group may have up to 8 carbon atoms, and is specifically a vinyl group. Suitable polydiorganosiloxanes include polydialkylsiloxanes such as α,ω-vinyldimethylsiloxy polydimethylsiloxane, polydiarylsiloxanes such as α,ω-vinyldiphenylsiloxy polydiphenylsiloxane, or polyalkylarylsiloxanes such as α,ω-vinylmethylphenylsiloxy polymethylphenylsiloxane, and the like. Copolymers comprising dialkylsiloxane and diarylsiloxane groups may also be used, for example vinyl-terminated copoly(dimethylsiloxane/diphenylsiloxane). Mixtures comprising at least one of the foregoing second polymers may also be used, for example triallyl isocyanurate.

Small molecule crosslinking agents may also be used, for example triallyl isocyanurate, triallylcyanurate, diallyl phthalate, divinyl benzene, and multifunctional acrylate monomers (e.g., the Sartomer compounds available from Arco Specialty Chemicals Co.), and combinations thereof, all of which are commercially available. The cross-linking agent content of the thermosetting composition can be readily determined by one of ordinary skill in the art, depending upon the desired flame retardancy of the composition, the amount of the other constituent components, and the other properties desired in the final product. In general, effective quantities are about 0.5 to about 15, specifically about 1 to about 10, more specifically about 5 to about 8 wt. %, based on the total weight of the resin portion of the dielectric material.

Preferred curing agents are organic peroxides such as dicumyl peroxide, t-butyl perbenzoate, 2,5-dimethyl-2,5-di (t-butyl peroxy)hexane, alpha, alpha-bis(t-butyl peroxy)diisopropylbenzene, and t-butylperoxyhexyne-3, all of which are commercially available. They may be used alone or in combination. Typical amounts of curing agent are from about 1.5 part per hundred parts of the total resin composition (PHR) to about 6 PHR. Relatively low temperature cure of the dielectric materials may be achieved using an appropriate amount of organic peroxide such as dicumyl peroxide and t-butyl perbenzoate peroxide.

In order to improve the toughness and/or reduce the brittleness of the polymers, an elastomer may optionally be added to the compositions. Suitable optional elastomers include, for example, ethylene-propylene elastomer (EPR); ethylene-propylene-diene monomer elastomer (EPDM); styrene-butadiene elastomer (SBR); styrene butadiene block copolymers (SB); 1,4-polybutadiene; other polybutadiene block copolymers such as styrene-isoprene-styrene triblock (SIS), styrene-(ethylene-butylene)-styrene triblock (SEBS), styrene-(ethylene-propylene)-styrene triblock (SEPS), and styrene-(ethylene-butylene) diblock (SEB); polyisoprene; elastomeric (meth)acrylate homopolymers and copolymers; silicone elastomers; fluoropolymer elastomers; butyl rubber; urethane elastomers; norbornene and dicyclobutadiene based elastomers; butadiene copolymers with acrylonitrile, (meth) acrylate esters or carboxylated vinyl monomers; copolymers of isoprene with acrylonitrile, acrylate esters, methacrylate esters or carboxylated vinyl monomers; and combinations comprising one or more of the foregoing elastomers.

The elastomer, when present is specifically used in an amount of about 1 wt % up to about 50 wt % of the total weight of the dielectric material. Specific amounts are about 5 to about 40 wt %, and even more specifically about 10 to about 30 wt %, based on the total weight of the dielectric material.

In addition to, or in place of, the optional dispersed POSS, the dielectric material may comprise one or more other dielectric particulate fillers. Useful particulate fillers include, but are not limited to, titanium dioxide (rutile and anatase), barium titanate, strontium titanate, silica (particles and hollow spheres) including fused amorphous silica and fumed silica; other hollow ceramic spheres, corundum, wollastonite, aramide fibers (e.g., KEVLAR from DuPont), fiberglass, $Ba_2Ti_9O_{20}$, glass spheres, quartz, boron nitride, aluminum nitride, silicon carbide, beryllia, alumina, and magnesia. The particulate fillers may be used alone or in combination. Particularly useful particulate fillers are rutile titanium dioxide and amorphous silica because these fillers have a high and low dielectric constants, respectively, thereby permitting a broad range of dielectric constants combined with a low dissipation factor to be achieved in the final product by adjusting the respective amounts of the two fillers in the composition. To improve adhesion between the fillers and polymer, the filler may be treated with one or more coupling agents, such as silanes, zirconates, or titanates.

The total amount of dielectric particulate filler, when present, is generally about 20 to about 80 wt % of the total weight of the dielectric composition. Specific amounts are about 30 to about 70 wt %, and even more specifically about 40 to about 60 wt %, based on the total weight of the dielectric material.

Particularly when used as a dielectric substrate, the dielectric material may further comprise a fibrous web, which is herein defined as a woven or non-woven assemblage of fibers capable of withstanding the processing conditions involved in the formation of the dielectric material, circuit board materials, and circuits formed therefrom. The fibrous web comprises thermally stable webs of a suitable fiber, specifically glass (E, S, and D glass) or high temperature polymer fibers (e.g., KODEL polyester from Eastman Kodak or polyphenylene sulfide fiber from Phillips Petroleum), Vectris from Kuraray. Such thermally stable fiber reinforcement provides the composite with the desired structural rigidity. In addition, the use of the fibrous web renders a dielectric material with a relatively high mechanical strength.

Specific examples of the fibrous web are set forth in the following Table:

| Manufacturer | Style | Thickness (inches) |
| --- | --- | --- |
| Fiber Glast | 519-A | 0.0015 |
| Hexcel-Schwebel | 1674 | 0.0045 |
| Hexcel-Schwebel | 1080 | 0.0025 |
| BGF | 106 | 0.0015 |
| BGF | 7628 | 0.0069 |

The fibrous web can comprise about 10 wt % to about 50 wt % of the total weight of the dielectric material. Specific amounts are about 15 wt % to about 40 wt %, and even more specifically about 20 to about 30 wt %, based on the total weight of the dielectric material. The thickness of the dielectric material is specifically about 1 to about 120 mils (about 0.025 to about 3.05 millimeters).

In general, the POSS-containing polymer systems are processed in solution. The polymer comprising covalently bound POSS, any additional polymers, any dispersed POSS, any particulate fillers, and any optional components such as peroxides, cross-linking agents such as vinyl alkoxysilanes, may be thoroughly mixed in any solvent in which the polymer system is soluble. The mixing temperature is regulated to avoid substantial decomposition, crosslinking, or other reaction of the components. Mixing continues until the particulate filler is uniformly dispersed throughout the composition. The particulate filler may be pretreated with silanes in a separate step for more efficient use of the agents. Optionally, silanes as well as peroxide curing agents may be included in the slurry.

If the composition comprises a woven or non-woven web, the slurry can be coated onto the web as, for example, a varnish. After the solvent is removed from the web, the web is in the form of a prepreg.

Useful conductive layers for the formation of circuit materials, circuits, and multi-layer circuits include stainless steel, copper, aluminum, zinc, iron, transition metals, and alloys comprising at least one of the foregoing, with copper specifically useful. There are no particular limitations regarding the thickness of the conductive layer, nor are there any limitations as to the shape, size or texture of the surface of the conductive layer. Specifically however, the conductive layer has a thickness of about 3 micrometers to about 200 micrometers, with about 9 micrometers to about 180 micrometers especially useful. When two or more conductive layers are present, the thickness of the two layers may be the same or different.

Copper conductive layers are especially useful. The copper conductive layer can be treated to increase surface area, treated with a stabilizer to prevent oxidation of the conductive layer (i.e., stainproofing), or treated to form a thermal barrier. Both low and high roughness copper conductive layers treated with zinc or zinc alloy thermal barriers are particularly useful, and may further optionally comprise a stain-proofing layer. Such copper conductive layers are available from, for example, Co-Tech under the trade names "TWX", "TW", and "TAX"; from Oak-Mitsui under the tradename "TOB"; from Circuit Foil Luxembourg under the tradename "TWS" and "NT TOR"; from Gould Electronics under the tradename "JTCS"; and from Chang Chun Petrochemical Company under the trade name "PINK".

As previously stated, the polymer comprising a bound POSS is useful as a dielectric material for the formation of circuit materials such as circuit laminates, bond plies, and resin coated conductive layers, all or some of which may be used to form circuits and multi-layer circuits. Depending on the degree of flowability of the dielectric material, the dielectric material may be used to form a dielectric substrate, for substantially non-flowable dielectric such as is found in a resin coated conductive layer, or a flowable dielectric such as a bond ply. Dielectric substrates are characterized by a substantially low degree of flowability during circuit manufacture and use. It is contemplated that dielectric materials comprising materials other than those disclosed herein may be used in combination with the dielectric materials disclosed herein to form circuit materials, circuits and multi-layer circuits.

When using a batch or semi-continuous process, at least one layer of the dielectric material comprising a polymer comprising a covalently bound POSS, and any desired optional additional layers used to form the circuit or multi-layer circuit are arranged in a desired order to form a stack. The stack is then placed in a press, which may or may not be evacuated to form a vacuum. In a typical press-cycle, the temperature is increased at a rate of about 2 to about 110° C./minute. Once the temperature reaches the desired lamination temperature the pressure is increased to about 2 to about 3 MegaPascal (MPa). While the desired temperature depends upon the composition of the dielectric material, the temperature is typically about 100° C. to about 170° C., specifically about 130° C. The stack is held at the desired temperature and pressure for a time sufficient to adhere the layers, about 5 to about 45 minutes. The resulting article is then cooled while maintaining the desired pressure. The stack may optionally be post-baked at a temperature of about 200° C. to about 350° C., specifically about 250° C. for about 2 hours. The article may be removed from the press when the temperature is about 100° C. or lower, and stored until used.

A first exemplary embodiment is shown in FIG. 1, wherein a circuit material 10 comprises a conductive layer 20 disposed on a dielectric material 12. As used herein and throughout the disclosure, "disposed" includes layers that partially or wholly cover each other. Dielectric material 12 comprises a polymer comprising a covalently bound POSS 14, a particulate filler 16, and a woven web 18. A single clad circuit laminate is provided when dielectric layer 20 is substantially non-flowable (i.e., a dielectric substrate) and a resin covered conductive layer is provided when dielectric layer 20 is flowable during circuit manufacture, e.g., during lamination.

Figure 2:
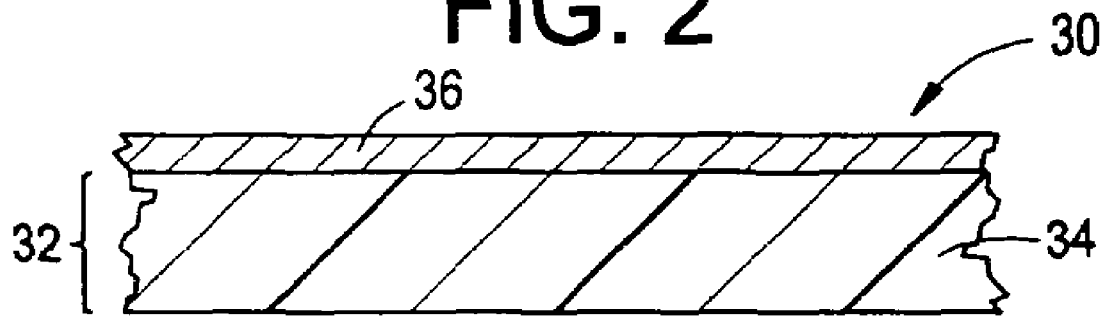
FIG. 2 is a schematic representation of an exemplary circuit material comprising a comprising a covalently bound polyhedral silsesquioxane polymer material and a conductive layer.

FIG. 2 depicts an alternative embodiment, wherein a circuit material 30 comprises a dielectric layer 32 comprising a polymer comprising a covalently bound POSS 34 without particulate filler or woven web. Dielectric layer 32 is disposed on a conductive layer 36. A single clad circuit laminate is provided when dielectric layer 32 is substantially non-flowable (i.e., a dielectric substrate) and a resin covered conductive layer is provided when dielectric layer 32 is flowable during circuit manufacture, e.g., during lamination. Additionally, conductive layer 36 may be in the form of a circuit layer (not shown) to form a single clad circuit (not shown).

Figure 3:
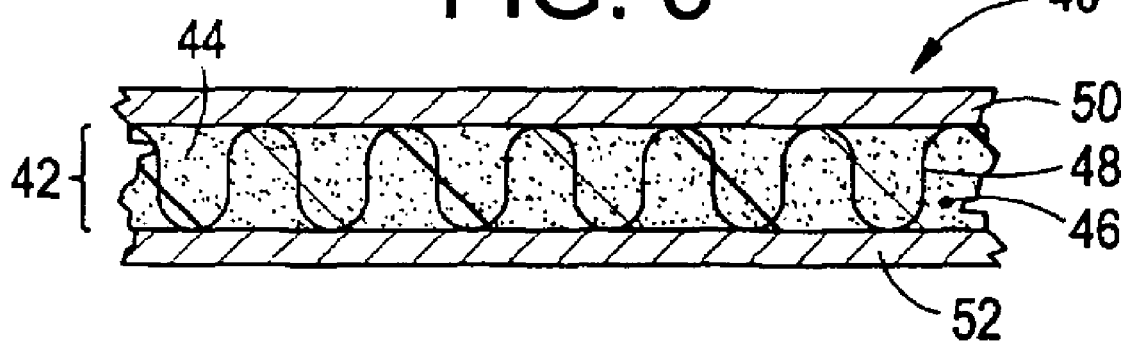
FIG. 3 is a schematic representation of an exemplary double clad circuit material comprising a covalently bound polyhedral silsesquioxane polymer material, a woven web and two conductive layers.

Another exemplary embodiment is shown in FIG. 3, wherein a double clad circuit laminate 40 comprises a dielectric substrate 42 disposed between a conductive layer 50 and a conductive layer 52. Dielectric substrate 42 comprises a polymer comprising a covalently bound POSS 44, a particulate filler 46, and a woven web 48. Additionally, one or both conductive layers 50, 52 may be in the form of a circuit layer (not shown).

Figure 4:
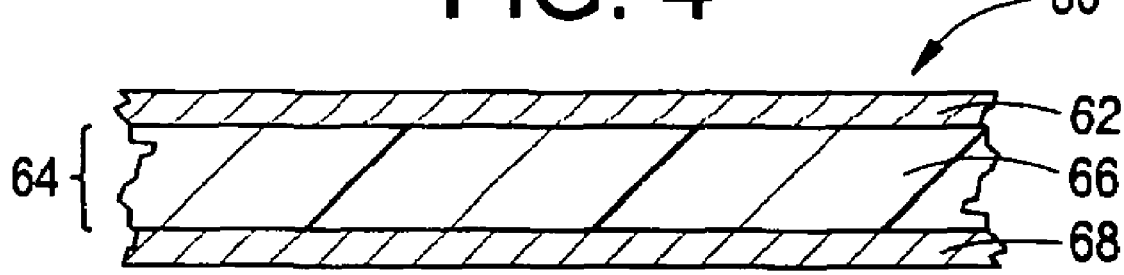
FIG. 4 is a schematic representation of an exemplary double clad circuit material comprising a covalently bound polyhedral silsesquioxane polymer material and two conductive layers.

FIG. 4 shows an alternative embodiment of a double clad circuit laminate 60 comprising a dielectric substrate 64 disposed between a conductive layer 62 and a conductive layer 68. Dielectric substrate 64 comprises a polymer comprising a covalently bound POSS 66 without the addition of a particulate filler or a woven web. Additionally, one or both conductive layers 62, 68 may be etched to form circuit layer(s) (not shown).

Figure 5:
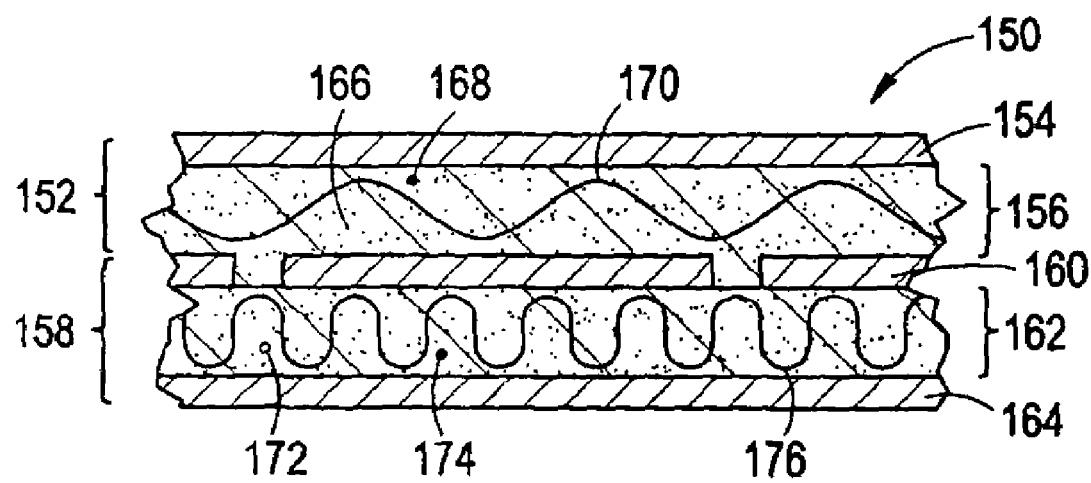
FIG. 5 is a schematic representation of an exemplary double clad circuit laminate comprising a covalently bound polyhedral silsesquioxane polymer material.

FIG. 5 depicts a multi-layer circuit 150 comprising an embodiment of a resin coated conductive layer 152. Here, resin coated conductive layer 152 comprises a conductive layer 154 disposed on a flowable dielectric material 156. Flowable dielectric material 156 is disposed on a circuit layer 160 of a double clad circuit 158 on a side of circuit layer 160 opposite to a dielectric substrate layer 162. Dielectric substrate layer 162 is disposed on a conductive layer 164. In this embodiment, flowable dielectric material 156 comprises a particulate filler 168, and/or a woven web 170. In another embodiment, the web may be omitted (not shown). Dielectric substrate layer 162 comprises a particulate filler 174, and/or a web 176. At least one of flowable dielectric material 156 and/or dielectric substrate 162 comprises a polymer comprising a covalently bound POSS 166, 172.

Figure 6:
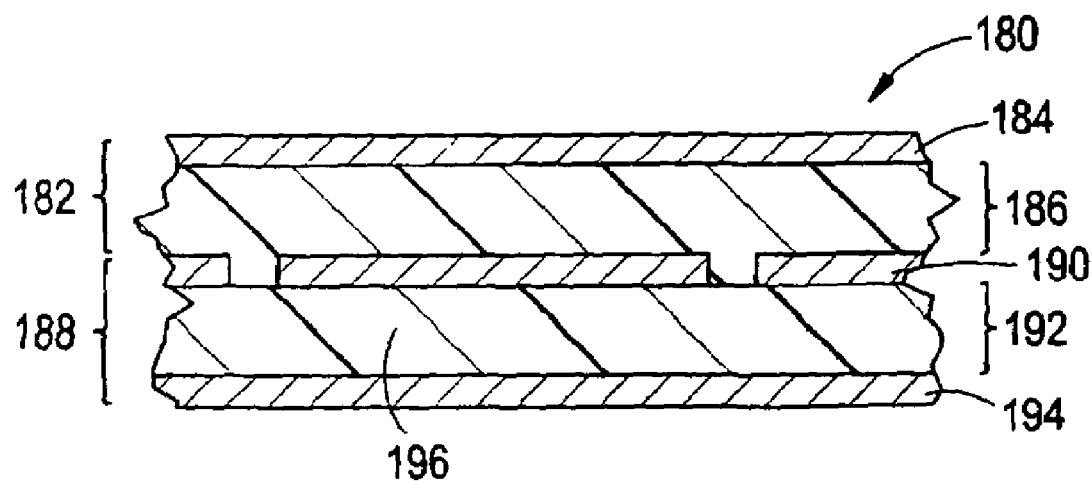
FIG. 6 is a schematic representation of an exemplary multi-layer circuit comprising a covalently bound polyhedral silsesquioxane polymer material.

FIG. 6 depicts a multi-layer circuit 180 comprising a resin coated conductive layer 182 disposed on a double clad circuit 188. Resin coated conductive layer 182 includes a conductive layer 184 disposed on a flowable dielectric material 186. Double clad circuit 188 comprises a dielectric substrate 192 disposed between a circuit layer 190 and a conductive layer 194. At least one of flowable dielectric material 186 and/or dielectric substrate 192 comprises a polymer comprising a covalently bound POSS. One or both of flowable dielectric material 186 and/or dielectric substrate 192 may comprise a particulate filler.

The dielectric material as described above has acceptable dielectric properties, that is, a dielectric constant of less than about 4, specifically less than about 3.8, more specifically less than about 3.6; and a dissipation factor of less than about 0.015, specifically less than about 0.010, even more preferably less than about 0.008, each measured over 1 to 10 gigahertz (GHz). The dielectric materials are rated V-0 when measured according to UL-94, with a burn time of about 1 second. Z-axis coefficient of thermal expansion is less than about 60 ppm specifically less than about 40 ppm.

The invention is illustrated by the following non-limiting examples.

Materials used in the preparation of the following examples include: POSS resin system, available from Hybrid Plastics Inc. under the trade name PM1284X; vinyl-terminated copoly(dimethylsiloxane/diphenylsiloxane) available from Gelest under the trade name PS782; fused amorphous silica powder available from CE Minerals under the trade name. CE 44i; silicone resin (phenyl silsesquioxane), available from Nusil Chemical Corporation under the trade name CF-4721; triethoxysilyl-modified poly-1,2-butadiene ("M-PBD"), available as a 50 wt % solution in toluene from Gelest (viscosity 100-200 cSt., Mw 3500-4500, density 0.90); vinyl trimethoxysilane ("silane"), available from General Electric Corporation under the trade name A-171; and triallyl isocyanurate ("TAIC"), available from Nippon Kasei Chemical Inc under the trade name Perkalink 301. Dicumyl peroxide ("Dicup") was used as an initiator. The glass cloth used in preparing the laminates of the examples is style 1080 woven glass cloth from Hexcel-Schwebel Corporation. Copper foil used for preparing laminates is ½ ounce per square foot (oz./ft$^2$) copper foil obtained from Mitsui Corporation available under the trade name MQ-VL. These materials are included in the components summary in Table 1, below.

Flame/flameout testing is performed according Underwriter's Laboratory Method UL-94. A flame having an inner cone of height ¾" (1.9 cm) is applied to each specimen so that a distance of ⅜" (1.0 cm) separates the lower end of the specimen from base of the flame. The flame is held in that position for 10 seconds and then removed. A burn time ($T_1$) is defined as the time required for the flame issuing from the specimen to disappear. If burning of the specimen ceases within a $T_1$ of 30 seconds, the flame is reapplied for an additional 10 seconds and a second burn time ($T_2$) is determined. UL flammability ratings according to Underwriter's Laboratory method UL-94 are as follows:

For a V-0 rating, no individual burn times, from the first or second application may exceed 10 seconds. The total of the burn times for any five specimens may not exceed 50 seconds. Drip particles that ignite a piece of cotton gauze situated below the specimen are not allowed.

For a V-1 rating, no individual burn times, from the first or second application may exceed 30 seconds. The total of the burn times for any five specimens may not exceed 250 seconds. Drip particles that ignite a piece of cotton gauze situated below the specimen are not allowed.

For a V-2 rating, no individual burn times, from the first or second application may exceed 30 seconds. The total of the burn times for any five specimens may not exceed 250 seconds. Drip particles that ignite a piece of cotton gauze situated below the specimen are allowed.

An F rating indicates flammable.

Dielectric constant is determined according to IPC-TM-650-2.5.5.5. Dissipation factor is determined according to IPC-TM-650-2.5.5.5. Percent water absorption is determined according to ASTM D570.

Laminates prepared in the examples were formed using the cure conditions given in Table 1. Where alternative lamination temperatures and durations are indicated, the conditions used are specified in the examples. Lamination is performed at 100 psi, except optional post treatment, which is performed in an oven at atmospheric pressure.

TABLE 1

| Cure conditions | | |
|---|---|---|
| Heating stage | Laminating Temperature* | Duration |
| 1 | 130° C. | 2 hrs |
| 2 | 150° C. | 2 hrs |
| 3 | 200° C. | 1 hr |
| 4 | 250° C. or 290° C. | 1 hr or 2 hr |
| Post Treatment (optional) | 400° C. or 425° C. | 2 hr |

*Laminating temperatures are temperature holds; temperatures are ramped up to the next heating stage after the end of the duration of each stage.

EXAMPLE 1

In this example, a composite materials system was made containing 33.5 parts by weight PM1284×47.1 parts by weight CE 44i, and 0.7 parts by weight dicup. These components were mixed in xylene at a concentration of 50% solids by weight, then coated onto style 1080 woven glass cloth, such that the cloth provided 18.8 parts by weight on a dry solids basis. The dried pre-preg was then laminated between two sheets of copper foil at the temperature profile shown in Table 2, wherein heating stage 4 was carried out at 250° C. for 1 hour. The resultant laminate had excellent dielectric properties, as shown in Table 2.

EXAMPLE 2

In this example, a composite material system was made containing 31.4 parts by weight PM1284X, 3.2 parts of PS782, 49.5 parts by weight CE 44i, and 0.7 parts by weight dicup. These components were mixed in xylene at a concentration of 50% solids by weight and coated onto glass cloth such that the cloth provided 15.2 parts by weight on a dry solids basis. The dried pre-preg was then laminated between two sheets of copper foil at the temperature profile shown in Table 2, wherein heating stage 4 was carried out at 250° C. for 1 hour. The resultant laminate had excellent dielectric and flame retardant properties as shown in Table 2.

TABLE 2

| Ex. | Dk* | Df | Water Abs. (%) | CTE, x axis (ppm) | CTE, y axis (ppm) | CTE, z axis (ppm) | Flame (UL-94) | Specific gravity (g/cc) |
|---|---|---|---|---|---|---|---|---|
| 1 | 3.41 | 0.0071 | 0.44 | 9.4 | 8.6 | 14.2 | V-0 | 1.79 |
| 2 | 3.3 | 0.0073 | 0.73 | 8.5 | 9.7 | 15.7 | V-0 | 1.76 |

*Dielectric constant was determined at a frequency of 4 GHz.

EXAMPLES 3-8

In these examples, composite materials systems were made containing 40.2 parts by weight of a blend of PM1284X and an additive A (see Table 3 for the ratios of additive A to PM 1284x), 47.4 parts by weight CE 44i, 0.4 parts by weight A-171, 0.4 parts by weight A-171, and 0.7 parts by weight dicup. These components were mixed in xylene at a concentration of 50% solids by weight, then coated onto glass cloth, such that the cloth provided 18.8 parts by weight on a dry solids basis. The dried pre-preg was then laminated between two sheets of copper foil using the temperature profile in Table 2, wherein heating stage 4 was carried out at 290° C. for 2 hours, unless otherwise indicated. Properties of the resulting laminates are given in Table 3 below.

TABLE 3

| Example | Additive (A) | Ratio of A to PM1284X | Dk | Df | Water Abs. (%) | Flame Retardance (UL-94) |
|---|---|---|---|---|---|---|
| 3 | PBD | 25:75 | 3.41 | 0.0060 | 0.67 | $T_1 > 30$ sec |
| 4 | PBD | 50:50 | 3.18 | 0.0044 | 0.73 | $T_1 > 30$ sec |
| 5 | PBD | 75:25 | 3.28 | 0.0047 | 0.41 | $T_1 > 30$ sec |
| 6 | M-PBD | 38:62 | 3.36 | 0.0063 | 1.03 | $T_1 > 30$ sec |
| 7* | TAIC | 13:87 | 3.45 | 0.0081 | — | $T_1 > 25$ sec |
| 8 | CF2-4721 | 12.5:87.5 | 3.36 | 0.0076 | — | — |

*Lamination was performed at 250° C./2 hrs.

The above results show that elastomers such as polybutadiene and modified polybutadiene, a small molecule crosslinking agent such as TAIC, and a polymeric silicone may be used to replace a portion of the polymeric POSS to modify the water absorbance, electrical properties, and flame retardance of the compositions used in the examples. As seen in the above examples, use of polybutadiene additive (modified or unmodified) as an increasing portion of the POSS charge results in an improvement generally in dielectric constant and lower water absorbance (except in the case of the modified PBD), but also results in a general decrease in flame retardance in comparison with Examples 1 and 2 having no BPD. Substitution of a minority portion of the POSS charge with CF2-4721, which is used as a lower cost diluent, results in comparable electrical properties to those of Example 1.

EXAMPLES 9-11

In these examples, composite materials systems were made containing 37.3 parts by weight of a blend of PM1284X and silane (see Table 5 for the weight ratios of silane to PM1284x), 43.1 parts by weight CE 44i, and 0.8 parts by weight dicup. These components were mixed in xylene at a concentration of 50% solids by weight, then coated onto glass cloth, such that the cloth provided 18.8 parts by weight on a dry solids basis. The dried pre-preg was then laminated between two sheets of copper foil according to the conditions described in Table 2, wherein heating stage 4 was carried out at 290° C. for 2 hours. Properties of the resulting laminates are shown in Table 4.

TABLE 4

| Example | Wt. Ratio Silane to PM1284X | Dk | Df | Water Abs. (%) | Flame Retardance* (UL-94) |
|---|---|---|---|---|---|
| 9 | 1.1:98.9 | 3.34 | 0.0053 | 0.53 | V-0 |
| 10 | 2.3:97.7 | 3.36 | 0.0062 | 0.54 | V-0 |
| 11 | 5.5:94.5 | 3.27 | 0.0059 | 0.64 | V-0 |

*$T_1 \leq 6$ Seconds & $T_2 = 0$

The above data shows that the silane additive does not adversely affect flammability, and that the dissipation factor (Df) is reduced by the addition of a low silane charge as compared to the results of Example 1 without added silane.

Post-Lamination Bake Studies

The laminates of Examples 3-7 and 9 were further treated with a post-lamination bake as shown in Table 2, wherein the post-lamination conditions used are specified in Tables 5 and 6 below. Comparative Example 1 was formulated without additives A according to the composition described for Example 1.

Table 5 shows a comparison of dielectric constant (Dk) and dissipation factor (Df) for the laminates from Examples 3-7 and 9 after lamination, and after post-lamination bake.

TABLE 5

| Ex. | Additive (A) | Ratio of A to PM1284X | Lamination Temp. | Dk | Df | Post Bake (° C.) | Dk | Df |
|---|---|---|---|---|---|---|---|---|
| 1 | N/A | 0:100 | 290° C./2 hrs | 3.38 | 0.0062 | 425° C./2 hrs | 3.36 | 0.0055 |
| 3 | PBD | 25:75 | 290° C./2 hrs | 3.41 | 0.0060 | 425° C./2 hrs | 3.41 | 0.0059 |
| 4 | PBD | 50:50 | 290° C./2 hrs | 3.18 | 0.0044 | 425° C./2 hrs | 3.16 | 0.0040 |
| 5 | PBD | 75:25 | 290° C./2 hrs | 3.28 | 0.0047 | 425° C./2 hrs | 3.27 | 0.0044 |
| 6 | M-PBD | 38:62 | 290° C./2 hrs | 3.36 | 0.0063 | 425° C./2 hrs | 3.32 | 0.0051 |
| 7 | TAIC | 13:87 | 250° C./2 hrs | 3.45 | 0.0081 | 425° C./2 hrs | — | — |
| 9 | Silane | 1.1:98.9 | 290° C./2 hrs | 3.34 | 0.0053 | 400° C./2 hrs | 3.29 | 0.0042 |

The above results show that postbaking of the laminate results in an improvement to the dissipation factor of the laminate.

Table 6 shows a comparison of percent water absorption for the laminates from Examples 3-7 after lamination, and after post-lamination bake.

TABLE 6

| Ex. | Additive (A) | Ratio of A to PM1284X | Lamination Temp. | Water Abs. (%) | Post-Bake (° C.) | Water Abs. (%) |
|---|---|---|---|---|---|---|
| 1 | N/A | 0:100 | 290° C./2 hrs | 0.67 | 425° C./2 hrs | 0.73 |
| 3 | PBD | 25:75 | 290° C./2 hrs | — | 425° C./2 hrs | 0.67 |
| 4 | PBD | 50:50 | 290° C./2 hrs | 0.73 | 425° C./2 hrs | 0.95 |
| 5 | PBD | 75:25 | 290° C./2 hrs | — | 425° C./2 hrs | 0.41 |
| 6 | M-PBD | 38:62 | 290° C./2 hrs | 1.03 | 425° C./2 hrs | — |

The above result show that postbaking does not have a significant effect on water absorption of the laminates.

The singular forms "a," "an," and "the" include plural referents unless the context clearly dictates otherwise. The endpoints of all ranges reciting the same characteristic are combinable and inclusive of the recited endpoint. All references are incorporated herein by reference.

While specific embodiments have been shown and described, various modifications and substitutions may be made thereto without departing from the spirit and scope of the invention. Accordingly, it is to be understood that the present invention has been described by way of illustration and not limitations.

What is claimed is:

1. A circuit material for the formation of circuits or multi-layer circuits, the circuit material comprising
    a first conductive layer;
    a layer of a dielectric material disposed on the first conductive layer, wherein the dielectric material comprises the reaction product of a polyhedral silsesquioxane and a dielectric polymer, wherein the dielectric polymer is an alkenyl-terminated polydialkylsiloxane, an alkenyl-terminated polydiarylsiloxane, an alkenyl-terminated polyalkylarylsiloxane, or an alkenyl-terminated copoly (dialkylsiloxane/diarylsiloxane); and
    a second conductive layer disposed on the layer of dielectric material on a side opposite the first conductive layer.

2. The circuit material of claim 1, wherein the dielectric polymer is a vinyl-terminated polydimethylsiloxane, a vinyl-terminated polymethylphenylsiloxane, or a vinyl-terminated copoly(dimethylsiloxane/diphenylsiloxane).

3. The circuit material of claim 1, wherein the layer of dielectric material further comprises an elastomer.

4. The circuit material of claim 3, wherein the elastomer is an ethylene-propylene, ethylene-propylene-diene monomer, styrene-butadiene rubber, styrene-butadiene block copolymer, 1,4-polybutadiene, styrene-isoprene-styrene, styrene-(ethylene-butylene)-styrene, styrene-(ethylene-propylene)-styrene, and styrene-(ethylene-butylene), polyisoprene, (meth)acrylate homopolymers, (meth)acrylate copolymers, silicone, fluoropolymer, butyl rubber, polyurethane, norbornene-containing polymers, dicyclobutadiene-containing polymers, butadiene-acrylonitriles, butadiene-(meth)acrylate ester, butadiene-carboxylated vinyl monomers, isoprene-acrylonitrile, isoprene-(meth)acrylate ester, isoprene-carboxylated vinyl monomer, or a combination comprising one or more of the foregoing elastomers.

5. A circuit comprising the circuit material of claim 3.

6. The circuit material of claim 1, wherein the layer of dielectric material further comprises a particulate filler, a dispersed polyhedral silsesquioxane, a fibrous web, or a combination comprising at least one of the foregoing materials.

7. The circuit material of claim 1, wherein the layer of dielectric material further comprises a crosslinking agent.

8. The circuit material of claim 1, wherein the conductive layer is copper.

9. The circuit material of claim 1, wherein the conductive layer is in the form of a circuit.

10. The circuit material of claim 1, wherein the bound polyhedral silsesquioxane has the formula $(RSiO_{1.5})_n$, wherein R is a vinyl moiety and n is 6, 8, 10, 12, or higher.

11. The circuit material of claim 10, wherein layer of the dielectric material further comprises a cross-linking agent.

12. The circuit material of claim 1, having a dielectric constant of less than about 4 and a dissipation factor of less than or equal to about 0.010 when measured over 1 to 10 GHz.

13. A circuit comprising the circuit material of claim 1.

14. A circuit material for the formation of circuits or multi-layer circuits, the circuit material comprising
    a first conductive layer; and
    a layer of a dielectric material disposed on the first conductive layer, wherein the dielectric material comprises
        the reaction product of a polyhedral silsesquioxane and a dielectric polymer, wherein the dielectric polymer is a polybutadiene, polyisoprene, polybutadiene-polyisoprene copolymer, or a combination comprising at least one of the foregoing polymers; and
        a polymer having a molecular weight of less than about 10,000 and that contains groups reactive with the polyhedral silsesquioxane.

15. The circuit material of claim 14, wherein the reactive groups are epoxy, maleate, hydroxy, carboxyl, methacrylate, vinyl, or a combination comprising at least one of the foregoing groups.

16. The circuit material of claim 14, wherein the polymer having a molecular weight of less than about 10,000 is a polybutadiene, a polyisoprene, or a combination comprising at least one of the foregoing polymers.

17. The circuit material of claim 14, wherein the polymer having a molecular weight of less than about 10,000 is a polybutadiene-based polymer functionalized with an epoxy, maleate, hydroxy, carboxyl or methacrylate group, a polyisoprene-based polymer functionalized with an epoxy, maleate, hydroxy, carboxyl or methacrylate group, or a combination comprising at least one of the foregoing polymers.

18. A circuit comprising the circuit material of claim 14.

19. The circuit material of claim 14, wherein the layer of dielectric material further comprises a particulate filler, a dispersed polyhedral silsesquioxane, a fibrous web, or a combination comprising at least one of the foregoing materials.

20. The circuit material of claim 14, wherein the layer of dielectric material further comprises a crosslinking agent.

21. The circuit material of claim 14, further comprising a second conductive layer disposed on the layer of dielectric material on a side opposite the first conductive layer.

22. The circuit material of claim 14, wherein the conductive layer is copper.

23. The circuit material of claim 14, wherein the conductive layer is in the form of a circuit.

24. The circuit material of claim 14, wherein the bound polyhedral silsesquioxane has the formula $(RSiO_{1.5})_n$, wherein R is a vinyl moiety and n is 6, 8, 10, 12, or higher.

25. The circuit material of claim 24, wherein layer of the dielectric material further comprises a cross-linking agent.

26. The circuit material of claim 14, having a dielectric constant of less than about 4 and a dissipation factor of less than or equal to about 0.010 when measured over 1 to 10 GHz.

* * * * *

UNITED STATES PATENT AND TRADEMARK OFFICE
CERTIFICATE OF CORRECTION

PATENT NO. : 7,572,515 B2  Page 1 of 1
APPLICATION NO. : 11/039378
DATED : August 11, 2009
INVENTOR(S) : Sethumadhavan et al.

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 774 days.

Signed and Sealed this

Fourteenth Day of December, 2010

David J. Kappos
*Director of the United States Patent and Trademark Office*